United States Patent [19]

Ichitsubo

[11] Patent Number: 4,568,896
[45] Date of Patent: Feb. 4, 1986

[54] HIGH FREQUENCY CIRCUIT DEVICE

[75] Inventor: Ikuro Ichitsubo, Sagamihara, Japan

[73] Assignee: Tokyo Shibaura Denki Kabushiki Kaisha, Japan

[21] Appl. No.: 688,528

[22] Filed: Jan. 3, 1985

Related U.S. Application Data

[63] Continuation-in-part of Ser. No. 510,239, Jul. 1, 1983, abandoned.

[30] Foreign Application Priority Data

Jul. 5, 1982 [JP] Japan ............................ 57-100638[U]

[51] Int. Cl.$^4$ ............................................. H01P 3/08
[52] U.S. Cl. ...................................... 333/238; 29/600; 156/291; 228/123
[58] Field of Search ................... 29/600; 228/122, 123; 333/238, 246; 361/399

[56] References Cited

U.S. PATENT DOCUMENTS 4,218,664 8/1980 Assal et al. ...................... 333/246 X Primary Examiner—Paul Gensler
Attorney, Agent, or Firm—Finnegan, Henderson, Farabow, Garrett & Dunner

[57] ABSTRACT

An improvement in a high-frequency circuit device wherein a dielectric substrate made of ceramic is provided at its top side with a high-frequency circuit and at its bottom side with a conductive film and wherein the substrate is joined to a grounding conductor of metallic material by means of solder or conductive bonding agent. In joining the conductive film to the grounding conductor, the solder or the conductive bonding agent is applied not to the entire surface of the conductive film but to a part of the film surface, i.e., only to a square, equilateral N-gon (where N is an even number) or circular region almost at the center of the entire film surface, whereby the substrate can be prevented from cracking in its heating and cooling processes.

6 Claims, 7 Drawing Figures

HIGH FREQUENCY CIRCUIT DEVICE

The present invention is a continuation-in-part application of U.S. patent application Ser. No. 510,239, filed July 1, 1983, now abandoned.

BACKGROUND OF THE INVENTION

The present invention relates to a high-frequency circuit device, and more particularly to an improvement in a high-frequency circuit device in which a dielectric substrate made of ceramic is mounted on a grounding conductor made of metallic material.

For high-frequency signals ranging from VHF to microwave, it is common to employ a circuit using microstrip lines. An example of the structure of a substrate for such a circuit is illustrated in FIG. 1. A dielectric substrate 11 is provided at its bottom side with a metallized conductive film 12 along the bottom surface and a high-frequency circuit 13 of microstrip line formed along the top surface. As shown in FIGS. 1 and 2, film 12 on the bottom of the substrate 11 operates as a grounding conductor with respect to high frequency signals. A high-frequency circuit device is completed by mounting such a circuit substrate in a metallic casing 21 which has input and output connectors 22 and 23 at its both ends. In the mounting, the grounding conductive casing 21 must be sufficiently coupled to the conductive film 12 to allow high-frequency signals to flow freely between the casing and film. Such coupling is effected by joining the substrate 11 and the casing 21 by means of set screws, solder or electrically-conductive bonding agent. The selection of the joining means depends mainly on the material, and dimensions of the dielectric substrate, and reliability and cost of the high-frequency circuit device. In particular, when the dielectric substrate 11 is made of ceramic, solder or conductive bonding agent is preferably employed for the coupling.

The use of solder or bonding agent has an advantage that the substrate 11 can be mechanically and firmly integrated with the casing 21, but has a disadvantage that the substrate is likely to be cracked due to the great difference of linear thermal expansion coefficient between the ceramic material of the substrate 11 and the metallic material of the casing 21, thereby undesirably causing thermal stress in the substrate. More particularly, ceramic has a linear thermal expansion coefficient of 5 to 10 ppm/° C., while metal used as the casing 21, such as copper, brass or aluminum is about 2 to 5 times as large as that of ceramic. Therefore, the expansion coefficient difference between the both materials is considerably large. Further, ceramic is mechanically fragile and expecially weak in pulling stress. For these reasons, if the substrate 11 of ceramic is joined directly to the casing 21 of metallic material with the use of solder or conductive bonding material, then the substrate tends to crack in the heating and cooling processes. In order to avoid this, there has been used an alloy which has almost the same linear thermal expansion coefficient as ceramic, for example, Kovar as the grounding conductor material (Kovar is a trademark of Westinghouse Electric Corporation for an iron-nickel-cobalt alloy. However, since this sort of special alloy is low in machinability and high in material cost, it is impossible to attain a less costly device even on a mass-production basis.

SUMMARY OF THE INVENTION

It is an objective of the present invention to provide an improved high-frequency circuit device which has eliminated the above defect in the prior art, and in which a dielectric substrate of ceramic can be favorably joined to the surface of a grounding metallic conductor to allow high-frequency signals to pass freely between the substrate and the conductor, without causing any cracks in the ceramic substrate, even if the ceramic is largely different from the conductor metal in the coefficient of linear thermal expansion.

Additional objectives and advantages of the present invention will be set forth in part in the description that follows and in part will be obvious from the description or may be learned by practice of the invention. The objects and advantages of the present invention may be realized and obtained by the methods and apparatus particularly pointed out in the appended claims.

The present invention overcomes the problems of the prior art and achieves the objects listed above by means of a high-frequency circuit device in which a ceramic dielectric substrate is provided at its top surface with a high-frequency circuit and at its bottom surface with a conductive film. The substrate is also mounted on a grounding conductor of metallic material. A bonding agent is applied only on the central area of the conductive film whose shape has an even number of (at least four) symmetrical axes, whereby said dielectric substrate is desirably bonded to said grounding conductor without causing any cracks in the substrate.

Analysis will first of all be made on the phenomenon to be resolved by the invention, i.e., the phenomenon that the substrate is cracked by thermal stress generated in the substrate when it is joined, for example, with solder. In this case, it is considered that the cracking occurs when a pulling stress is generated in the substrate due to a thermal deformation difference between the ceramic substrate and metallic grounding conductor and when the stress exceeds the tensile strength limit of ceramic. The magnitude of the stress depends on an external force applied to the substrate bottom surface as a function of temperature and on the shape of the substrate.

A dielectric substrate used for a microstrip circuit is usually a plate in shape having a thickness of about 0.1 to 2 mm as shown by numeral (11) in FIG. 1. The larger the longitudinal and transverse dimensions of the substrate are the larger the stress due to its expansion or contraction is, whereby the substrate tends to crack. The substrate cracking will be more likely to occur if the dimensions of the substrate become large but it largely depends upon the shape of the substrate.

For example, when an alumina substrate of 22 mm×25 mm square and 2 mm thick is soldered to a grounding conductor of copper throughout the entire surface thereof and it is left to be cooled, any cracks will not take place in the substrate. However, if a rectangular alumina substrate of 25 mm×12 mm×2 mm (which size is half of that of the former substrate) is similarly soldered to the grounding copper conductor and it is left to be cooled, a crack will tend to occur in the substrate. The condition of the substrate cracking in the latter case is illustrated in FIG. 3 in the form of perspective view, wherein the alumina substrate 11 soldered to the surface of a grounding conductor 31 has a longitudinal crack 32 almost in the middle of the sub-strate.

On the other hand, when the alumina substrate is abruptly heated from the room temperature to 150° C. and subjected to a thermal shock, the square substrate will not be subjected to any cracks but the rectangular substrate will be subjected to such a transverse crack 41 as shown in FIG. 4 in the middle of the substrate.

Such substrate cracking phenomenon can be explained as follows. In the case of FIG. 4, when the grounding metallic conductor having a larger expansion coefficient is heated and expanded, pulling stresses are applied to the associated ceramic substrate. At this time, a pulling stress applied to the substrate in the longitudinal direction is larger than that in the transverse direction, so that the pulling stress exceeds mechanical durability of the material, whereby such a crack as shown in FIG. 4 occurs in the substrate. In the case of FIG. 3, on the other hand, the substrate is left to be cooled and correspondingly is subjected to a strong compressing force in the longitudinal direction, so that a strong transverse pulling force occurs in the middle of the substrate, whereby the substrate is cracked along its longitudinal direction.

As will be appreciated from the above explanation, it can be concluded that the cracking in the rectangular ceramic substrate caused by heating or cooling results from an unbalance of the stresses generated in the longitudinal and the transverse directions. This conclusion will be confirmed from the fact that the large-sized square-shaped substrate has not been cracked.

In accordance with the present invention, the cracking of the rectangular ceramic substrate is prevented by applying such a bonding agent as solder or conductive material not onto the whole area of the conductive film but onto the central area alone which has four symmetrical axes, such as a square. The relationship between the length of a gap (shown in FIG. 5) and circuit performance was analyzed by varying the the length (1) of the gap. When 1 is nearly equal to one-fourth of the free-space wave-length (Y), (and Y=c/f, c=3×10$^{10}$ cm/s, and f is operating frequency) the circuit is significantly affected by the existence of the gap, probably on account of the electrical resonance in the gap region. However, for the condition defined by $1 \leq Y/8$, the operating characteristics of the circuit are essentially the same as a circuit without the gap. Thus, the bonding agent is applied to keep the symmetrical alignment of the conductive film, as well as maintaining the gap with the noted parameter for 1, i.e., $1 \leq Y/8$. Additionally, there are other shapes that provide isotropically balanced thermal stress. An application of the bonding agent only on such a selected-shaped area, as described, will cause the substrate to be balanced in the longitudinal and transverse stresses, whereby the substrate is not cracked.

According to the present invention, the substrate is not subjected to any cracks in heating and cooling processes and the ceramic substrate can be bonded to the grounding conductor of metal having a thermal expansion coefficient larger than ceramic.

BRIEF DESCRIPTION OF THE DRAWINGS

The above and other objects and advantages of the present invention will become clear from the following description with reference to the accompanying drawings, in which.

DESCRIPTION OF THE PREFERRED EMBODIMENTS

Figure 1:
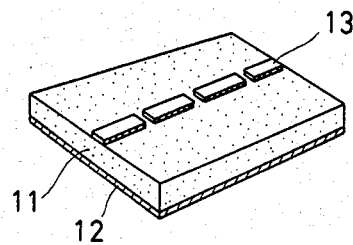
FIG. 1 is a perspective view showing a high-frequency circuit device of microstrip circuit type.
Figure 2:
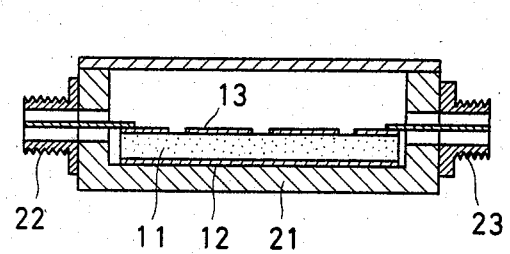
FIG. 2 is a sectional view of a high-frequency circuit mounted in a casing.
Figure 3:
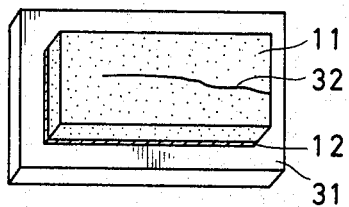
FIGS. 3 and 4 are perspective views of a rectangular alumina substrate soldered onto the whole surface of a grounding conductor, when the substrate is spontaneously cooled and abruptly heated, respectively.
Figure 4:
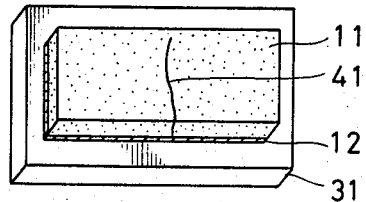
Figure 5:
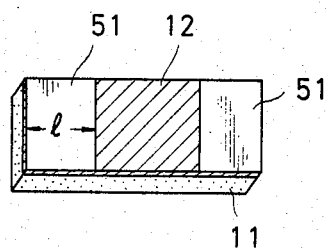
FIGS. 5, 6 and 7 are perspective views showing the bottoms of substrates to be used in the high-frequency circuit device in accordance with the present invention, in which the associated grounding conductors are removed.
Figure 6:
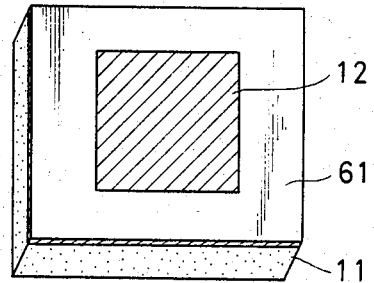

Referring now to FIGS. 5 and 6 there are shown bottom perspective views of substrates according to different embodiments of the present invention, in which the associated grounding conductors are removed.

In FIG. 5, the substrate 11 is provided at its bottom side with a conductive film. The film in turn is applied at its both sides with solder resists 51 and 51 to define a central square region 12 between the solder resist regions. The square region having four symmetrical axes is not applied with any solder resist and thus the conductive film is exposed at the central region 12. Solder is then applied to the exposed central region 12 to bond the conductive film to the associated grounding conductor. In the embodiment of FIG. 5, a rectangular alumina substrate measuring 25 mm×12 mm×2 mm has been soldered to a grounding conductor of copper, resulting in that the substrate has been perfectly soldered to the conductor.

A high frequency circuit, as shown in FIG. 5, has generally been discouraged, because it creates a gap between the substrate and the grounding conductor, thereby deteriorating circuit performance. The effect of the length (1) of the gap on circuit performance has been analyzed while varying the length of the gap. The circuit performance is significantly reduced, when 1 is approximately equal to one-fourth of the free-space wave-length (Y=c/f, c=3×10$^{10}$ cm/s and f is operating frequency). This is probably due to electrical resonance in the gap region. Additionally, when $1 \approx Y/4$ the circuit performance tends to be unstable showing the sensitivity to the mechanical stress applied to the circuit housing. As previously noted, when 1 is defined as being less than or approximately equal to Y/8, which is far from the harmful resonance, the circuit of this invention operates similar to a circuit without the gap. Thus, the bonding agent must be applied so that the noted parameter, i.e., $1 \leq Y/8$, and the symmetrical construction of the central area of conductive film 12 are maintained.

While the present invention has been described as having a central area for bonding which contains four symmetrical axes, nonetheless, other shapes will enable the thermal stress to balance isotropically, such as a circle. In this respect, an equilateral N-gon can be used effectively.

FIG. 6 shows an example in which the invention is applied to the ceramic substrate 11 of relatively large square shape which may tend to be subjected to cracks. In this connection, the peripheral region of the conductive film formed on the substrate is applied with a solder resist 61 so as to expose the conductive film at its central region 12 of square shape.

Figure 7:
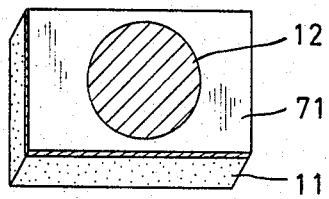

Referring to FIG. 7, the conductive film on the rectangular substrate 11 is applied at its peripheral region with solder resist 71 to leave the circular exposed conductive film region 12 at its center.

The ceramic substrate has been joined to the grounding conductor with solder in the above embodiments, but it should be understood that the present invention is not restricted to these embodiments but can be similarly applied to cases which use other conductive bonding agents in place of solder.

What is claimed is:

1. A high frequency circuit device comprising:
   a ceramic dielectric substrate having a high frequency circuit formed along the top surface and a conductive film formed along the bottom surface;
   a metal grounding conductor being joined to said substrate; and
   a bonding agent for joining said grounding conductor and said substrate, said bonding agent being applied to the central portion of said conductive film, the central portion having at least four symmetrical axes, the shortest length between the outer edge of said substrate and the periphery of said central portion being less than a predetermined fraction of the wavelength transmitted through said high frequency circuit.

2. The high frequency circuit device of claim 1, wherein said central portion is less than one-eighth of the wave-length transmitted through said high frequency circuit.

3. The high frequency circuit device of claim 1, wherein the shape of the central portion of said conductive film is square.

4. The high frequency circuit device of claim 1, wherein said bonding agent is a solder.

5. The high frequency circuit device of claim 1, wherein said bonding agent is a conductive type.

6. A high frequency circuit device comprising:
   a ceramic dielectric substrate having a high frequency circuit formed along the top surface and a conductive film formed along the bottom surface;
   a metal grounding conductor being joined to said substrate; and
   a bonding agent for joining said grounding conductor and said substrate, said bonding agent being applied to a central portion of said conductive film, the shape of said central portion being circular, the shortest length between the outer edge of said substrate and the periphery of said central portion being less than a predetermined fraction of the wave-length transmitted through said high frequency circuit.

* * * * *